(12) United States Patent
Yoshikawa et al.

(10) Patent No.: US 9,557,117 B2
(45) Date of Patent: Jan. 31, 2017

(54) COOLING STRUCTURE, ELECTRONIC DEVICE USING SAME, AND COOLING METHOD (75) Inventors: Minoru Yoshikawa, Tokyo (JP); Hitoshi Sakamoto, Tokyo (JP); Takeya Hashiguchi, Tokyo (JP)

(73) Assignee: NEC CORPORATION, Tokyo (JP)

( * ) Notice: Subject to any disclaimer, the term of this patent is extended or adjusted under 35 U.S.C. 154(b) by 697 days.

(21) Appl. No.: 13/062,258

(22) PCT Filed: Oct. 7, 2009

(86) PCT No.: PCT/JP2009/005220
§ 371 (c)(1),
(2), (4) Date: Mar. 4, 2011

(87) PCT Pub. No.: WO2010/050129
PCT Pub. Date: May 6, 2010

(65) Prior Publication Data
US 2011/0192574 A1     Aug. 11, 2011

(30) Foreign Application Priority Data
Oct. 29, 2008 (JP) .................. 2008-278808

(51) Int. Cl.
*F28D 15/00* (2006.01)
*F28D 15/02* (2006.01)
(Continued)

(52) U.S. Cl.
CPC ........... *F28D 15/0266* (2013.01); *F28F 9/026* (2013.01); *H01L 23/427* (2013.01); *H01L 2924/0002* (2013.01)

(58) Field of Classification Search
CPC ............................ F28D 15/0266; F28D 15/00
(Continued)

(56) References Cited

U.S. PATENT DOCUMENTS 4,450,472 A    5/1984  Tuckerman et al.
5,871,043 A *  2/1999  Osakabe et al. ......... 165/104.21
(Continued)

FOREIGN PATENT DOCUMENTS

FR    2579371 A1    9/1986
JP    56-137086 A   10/1981
(Continued)

OTHER PUBLICATIONS

International Search Report for PCT/JP2009/005220 mailed Dec. 22, 2009.
(Continued)

*Primary Examiner* — Devon Russell
(74) *Attorney, Agent, or Firm* — Sughrue Mion, PLLC (57) ABSTRACT A cooling structure is provided which includes: an evaporation chamber defined by a base plate having a boiling surface, a ceiling plate and a side wall; a plurality of plate-shaped fins arranged in parallel on the boiling surface, defining a plurality of coolant passages in the evaporation chamber, a liquid phase coolant flows through the coolant passages in one direction from one end portion thereof toward another end portion; a liquid return port formed in the side wall facing the one end portion of coolant passages; and a vapor port formed in the ceiling plate facing the other end portion of coolant passages, wherein space is formed between the ceiling plate and an upper end portion of the plurality of plate-shaped fins, the space expanding gradually from a liquid return port side of the side wall toward the vapor port.

13 Claims, 7 Drawing Sheets (51) Int. Cl.
*H01L 23/427* (2006.01)
*F28F 9/02* (2006.01)

(58) Field of Classification Search
USPC .................. 165/104.21, 104.27, 104.26
See application file for complete search history.

(56) References Cited

U.S. PATENT DOCUMENTS

| | | | |
|---|---|---|---|
| 6,173,761 B1* | 1/2001 | Chandratilleke et al. | 165/104.21 |
| 6,564,861 B1* | 5/2003 | Miyazaki et al. | 165/104.29 |
| 7,092,254 B1* | 8/2006 | Monsef et al. | 361/699 |
| 7,487,643 B2* | 2/2009 | Chen et al. | 62/6 |
| 7,686,071 B2* | 3/2010 | Silverstein | 165/110 |
| 7,743,818 B2* | 6/2010 | Liu et al. | 165/104.26 |
| 7,775,262 B2* | 8/2010 | Liu et al. | 165/104.26 |
| 7,980,295 B2* | 7/2011 | Takamatsu et al. | 165/104.26 |
| 2003/0205363 A1* | 11/2003 | Chu | F28D 15/0266 165/80.3 |
| 2006/0060331 A1* | 3/2006 | Glezer et al. | 165/104.29 |
| 2006/0185827 A1* | 8/2006 | Huang et al. | 165/104.25 |
| 2008/0283223 A1* | 11/2008 | Chang et al. | 165/104.26 |
| 2009/0014155 A1* | 1/2009 | Manzer | 165/104.24 |
| 2009/0084525 A1* | 4/2009 | Satou et al. | 165/104.21 |
| 2009/0097206 A1* | 4/2009 | Tomioka | 361/701 |
| 2009/0219695 A1* | 9/2009 | Tomioka | 361/700 |
| 2009/0266520 A1* | 10/2009 | Yu | 165/104.21 |
| 2009/0314472 A1* | 12/2009 | Kim et al. | 165/104.26 |
| 2010/0044014 A1* | 2/2010 | Ho | 165/104.26 |
| 2011/0198059 A1* | 8/2011 | Gavillet et al. | 165/104.26 |

FOREIGN PATENT DOCUMENTS

| | | | | |
|---|---|---|---|---|
| JP | 56137086 A | * | 10/1981 | F28D 15/00 |
| JP | 59-217346 A | | 12/1984 | |
| JP | 59217346 A | * | 12/1984 | H01L 23/44 |
| JP | 61-255042 A | | 11/1986 | |
| JP | 8-313178 A | | 11/1996 | |
| JP | H8-303919 A | | 11/1996 | |
| JP | 2001-196778 A | | 7/2001 | |
| JP | 2002026210 A | | 1/2002 | |
| JP | 2002168547 A | | 6/2002 | |
| JP | 2002-340489 A | | 11/2002 | |
| JP | 2004056121 A | | 2/2004 | |
| JP | 2004088048 A | | 3/2004 | |
| JP | 2004218887 A | * | 8/2004 | F28D 15/02 |
| JP | 2005019905 A | | 1/2005 | |
| JP | 2005147625 A | * | 6/2005 | F28D 15/02 |
| JP | 3964580 B | | 8/2007 | |
| JP | 2008249314 A | | 10/2008 | |

OTHER PUBLICATIONS

Japanese Office Action for JP Application No. 2010-535636 mailed on Jan. 21, 2014 with English Translation.
Japanese Office Action for JP Application No. 2010-535636 mailed on Sep. 2, 2014 with English Translation.

* cited by examiner

COOLING STRUCTURE, ELECTRONIC DEVICE USING SAME, AND COOLING METHOD

CROSS REFERENCE TO RELATED APPLICATION

The present application is the National Phase of International Application No. PCT/JP2009/005220 filed Oct. 7, 2009, which claims priority based on Japanese Patent Application No. 2008-278808 filed Oct. 29, 2008, the contents of all of which are incorporated herein by reference in their entirety.

TECHNICAL FIELD

The present invention relates to a cooling structure and a cooling method and more particularly to the cooling structure and the cooling method to cool a component to be cooled by using heat exchange of a coolant undergoing a phase change in an evaporation chamber and a condensation chamber mounted separately.

BACKGROUND TECHNOLOGY

In some cases, electronic devices of various types that generate heat while operating are provided with a cooling unit to avoid an influence of heat generated therein on a neighboring component. For example, in an LSI (Large Scale Integrated) circuit and/or IC (Integrated Circuit) to be used in an electronic device such as a computer or the like, circuit integration is increasing in an accelerated manner in each circuit generation and, as a result, an amount of heat generated therein tends to increase. To operate the LSI circuit and/or IC stably at high speed, it is necessary to control an operating temperature so as to be a predetermined temperature or less and, therefore, a cooling method corresponding to the amount of heat generated by the LSI circuit or IC is to be employed. However, in recent years, high speed signal transfer between the LSI circuit and/or IC and their peripheral parts rather than a high speed operation of the LSI circuit and/or IC themselves is more contributable to an improvement in operation speed of a computer. High speed signal transfer seems to be advantageously realized by shortening wiring length, however, the shortening of the wiring length makes it difficult to ensure space for mounting a cooling unit having a sufficient size corresponding to the amount of heat generated therein.

As a cooling method for an LSI circuit, a method is known in which a small cooling unit is mounted on the LSI circuit and a coolant housed in the cooling unit is circulated by a pump into a heat radiating portion with wider space so that heat by the cooling unit is transferred to the heat radiating portion and is then heat radiated into environmental air. Moreover, a heat pipe has been actually used that is configured to circulate a coolant after bringing about a phase change in coolant from liquid to vapor and then heat is transferred to a condensation chamber by utilizing a pressure difference caused by volume expansion. In the cooling method bringing about a phase change in coolant, higher cooling efficiency can be obtained compared with a method in which cooled water is circulated by a pump.

Specifically, this heat pipe does not use a tool requiring power such as a pump and replacement due to maintenance and/or life is not necessary and, as a result, is widely used. In the heat pipe, after evaporation of a coolant in a liquid phase in an evaporation chamber, the evaporated coolant is again cooled in a condensation chamber, resulting in radiation of heat and then a phase change in the coolant from vapor to liquid occurs and the resulting liquid phase coolant returns back into the evaporation chamber. The method in which the liquid phase coolant, in the circulation of the coolant, is returned back to the evaporation chamber by using gravity is called a heat-siphon type heat pipe or a boiling and cooling device.

Figure 12:
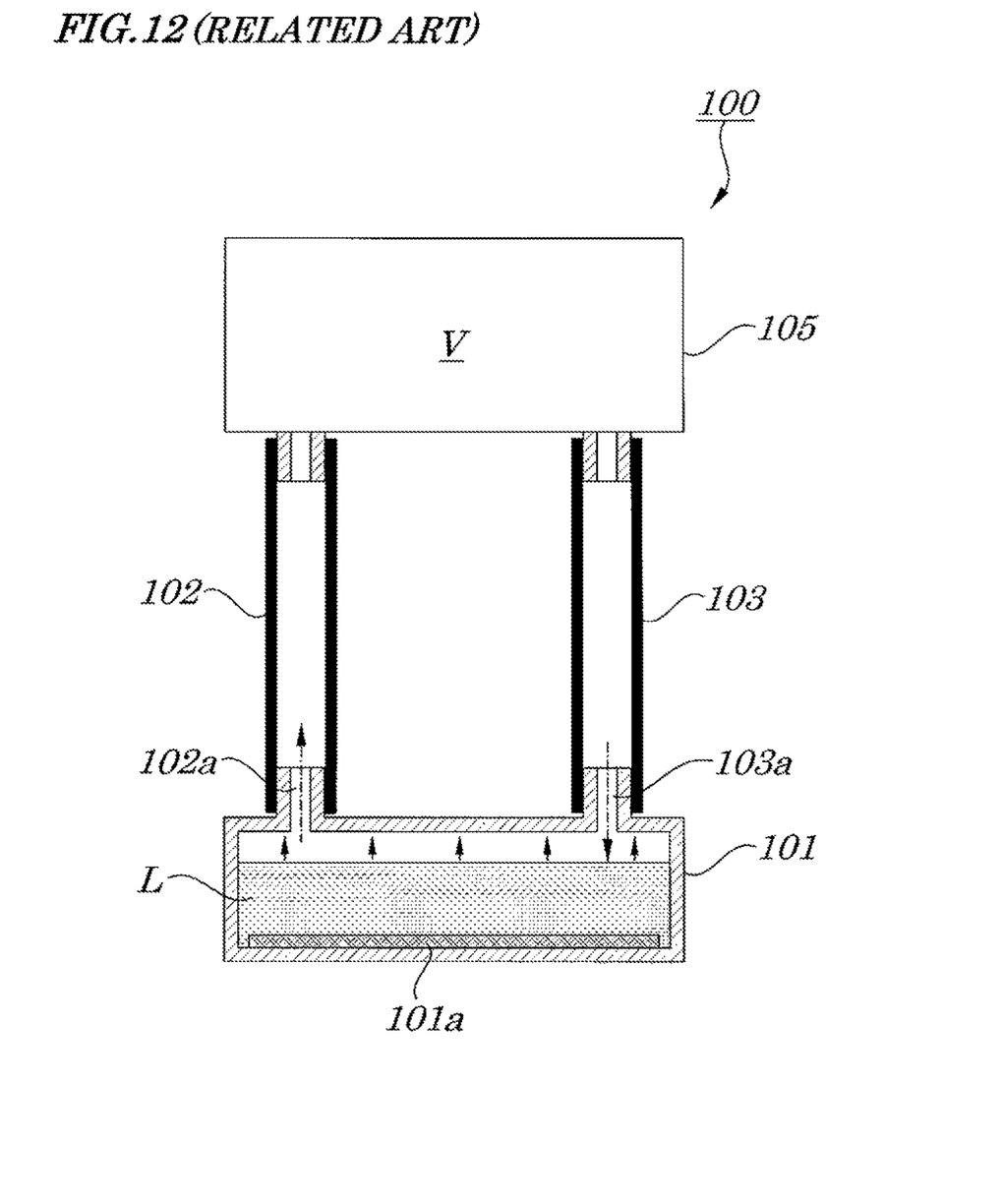

Examples of the above cooling unit are shown in FIG. 1 of Related Art Patent Reference 1, FIG. 4 of Related Art Patent Reference 2, and FIG. 1 of Related Art Patent Reference 3. In the cooling structure disclosed in the Related Art Patent References 1 to 3, as shown in the schematic diagram in FIG. 12, coolant in a liquid phase state (hereinafter, may be simply referred to as liquid phase coolant) L housed in an evaporation chamber 101 in a cooling unit 100 comes into contact with a boiling surface 101a to evaporate therein, resulting in production of coolant in a vapor phase state (hereinafter, may be simply referred to as vapor phase coolant) V, which cools the boiling surface 101a. The vapor phase coolant V produced in the evaporation chamber 101, as shown in FIG. 12, rises by buoyancy and passes through a vapor pipe (vapor passage) 102 mounted above the evaporation chamber 101 and enters a condensation chamber 105 to be cooled and is restored to the liquid phase coolant L. The liquid phase coolant L restored to a liquid phase after heat radiation in the condensation chamber 105, as shown by the arrows in FIG. 12, passes through a liquid return pipe (liquid return passage) 103 mounted or the evaporation chamber 101 and returns back to the evaporation chamber 101 for circulation.

However, cooling efficiency of the cooling structures described in the Related Art Patent References 1 to 3 is not enough to cool an LSI circuit and/or IC which generates a large amount of heat. The reason for the above is that both the vapor port 102a of the vapor pipe 102 and liquid return port 103a of the liquid return pipe 103 exist in a same direction of the evaporation chamber at the time of circulation of coolant in the cooling structure and, as a result, the vapor phase coolant V rising upward as vapor strikes the liquid phase coolant L dropping downward as liquid. That is, the vapor phase coolant V rising by buoyancy and the liquid phase cool ant L dropping downward by gravity move in a direction opposite to each other and interfere with the movement of the coolant, thus making it difficult for the vapor phase coolant V to escape into the condensation chamber 105, resulting in an increase of pressure in the evaporation chamber 101. The increase in internal pressure in the evaporation chamber 101 causes an increase in saturated vapor pressure of the coolant, which raises its boiling point. Therefore, cooling efficiency is lowered.

Moreover, in FIG. 4 of Related Art Patent Reference 4, a cooling unit is configured with an integrally constructed evaporation chamber and condensation chamber without using a vapor pipe and a liquid return pipe. According to this cooling unit, the coolant is partitioned into a liquid phase coolant and a vapor phase coolant in the evaporation chamber, whereby striking between the liquid phase coolant and vapor phase coolant is avoided and, as a result, a decrease in cooling capability can be prevented.

In FIGS. 2, 5, and 8 of Related Art Patent Reference 5, a cooling unit is disclosed in which an evaporation chamber and a condensation chamber are integrally constructed and a partitioning unit is mounted between the evaporation chamber and condensation chamber, thereby avoiding the decrease in coolant capability and enabling the circulation of the coolant. In this cooling structure, the vapor phase coolant is transferred through a vapor pipe from the evaporation chamber to the condensation chamber to bring about a phase change in a liquid phase coolant, which is then returned back to the evaporation chamber from the condensation chamber formed above the evaporation chamber.

In FIG. 2 of Related Art Patent Reference 6 and in FIGS. 1 and 2 of Related Art Patent Reference 7, a cooling unit is disclosed in which a liquid return port of a liquid return pipe extending from a condensation chamber is allowed to enter the liquid phase coolant housed in an evaporation chamber, whereby the decrease in cooling capability is avoided and the coolant is circulated. In this cooling structure, the liquid phase coolant cooled in the condensation chamber is returned back into the evaporation chamber without coming into contact with the vapor phase coolant that evaporates in the evaporation chamber. FIG. 3 of the Related Art Patent Reference 4 shows that cooling fins are mounted in a standing state to improve evaporating efficiency (cooling efficiency) in the evaporation chamber.

Furthermore, the Related Art Patent Reference 4 discloses that, when the liquid phase coolant coming into contact with a boiling surface of the evaporation chamber evaporates, a nucleus (cavity) of the vapor phase coolant in a small state is formed on a surface of the boiling surface. One example of the formation of a nucleus of the vapor phase coolant is shown in FIGS. 4 and 5 of Related Art Patent Reference 8. Generally, the generation of bubbles at time of boiling the nucleus is caused by non-uniform nucleus formation and the formation of a flaw and/or hollow on a boiling surface operating as a heat conduction surface become a cause for the generation of bubbles and, as a result, much more bubbles are generated which facilitates a phase change from liquid to vapor.

RELATED ART DOCUMENTS

Related Art Patent References

Related Art Patent Reference 1: Japanese Patent. Application Laid-open No. 2004-088048 (FIG. 1)
Related Art Patent Reference 2: Japanese Patent No. 3964580 (FIG. 4)
Related Art Patent Reference 3: Japanese Patent Application Laid-open No. 2002-16847 (FIG. 1)
Related Art Patent Reference 4: Japanese Patent Application Laid-open No. 2002-02610 (FIG. 1)
Related Art Patent Reference 5: Japanese Patent Application Laid-open No. Sho56-137086 (FIGS. 2, 5, and 8)
Related Art Patent Reference 6: Japanese Patent Application Laid-open No. Sho61-255042 (FIG. 2)
Related Art Patent Reference 7: Japanese Patent Application Laid-open No. Sho59-217346 (FIGS. 1 and 2); and
Related Art Patent Reference 8: Japanese Patent Application Laid-open No. 2004-0561121 (FIGS. 4 and 5)

SUMMARY OF INVENTION

Problems to be Solved by the Invention

However, the above conventional cooling structure has a problem that heat transfer cannot be effectively facilitated only by a formation of a nucleus producing bubbles of vapor liquid coolant on a boiling surface. That is, when liquid evaporates to cause a phase change from liquid to vapor, heat energy is required. Therefore, increased formation of nucleus producing bubbles on the boiling surface, since the more heat energy can be used for production of bubbles, is effective in an improvement of cooling efficiency. However, remaining of bubbles at a place of nucleus formation inhibits new production of bubbles.

That is, when the bubbles are separated and rise upward, buoyancy of the bubbles itself is used and, therefore, growth of the bubbles enough to generate buoyancy for the separation and rising from the boiling surface is required, thus resulting in remaining of bubbles at the boiling surface for a long time and in inhibition of an improvement of cooling capability.

Incidentally, it is proved by study of the inventor of the present invention that, if an amount of generated heat is small, the formation of nucleus on the boiling surface is effective in the improvement of cooling efficiency, however, if the amount of generated heat becomes large, bubbles are produced from a surface other than the nucleus surface, which does not contribute to the improvement in cooling efficiency. That is, in the case of large amounts of generated heat, heat transfer of boiling type is promoted little by the formation of nucleus on the boiling surface, but highly affected by the remaining of bubbles produced by the nucleus on the boiling surface.

In all the cooling structures disclosed in the Related Art Patent References 1 to 8, flow of the liquid phase coolant and vapor phase coolant coming into contact with the boiling surface of the evaporation chamber is not taken into consideration and bubbles of the vapor phase coolant remaining in the boiling surface in the evaporation chamber can be successfully removed. For example, in the cooling structure described in the Related Art Patent Reference 5, the flow of the liquid phase coolant returned back into the evaporation chamber is not utilized and the liquid phase coolant simply stays in the evaporation chamber and continues to be in contact with the boiling surface. Moreover, in the cooling structure described in the Related Art Patent References 6 and 7, a liquid return port to cause the liquid phase coolant to flow into the evaporation chamber is located far from the boiling surface and as a result, the liquid phase coolant stays easily thereunder, thus causing a decrease in flowing speed of the liquid phase coolant. In the cooling structure described in the Related Art Patent References 6 and 7, an aperture for guiding the vapor phase coolant in the evaporation chamber into the condensation chamber is formed in the above portion of the center of the boiling surface and, therefore, both the liquid phase coolant and vapor phase coolant easily remains on a side opposite to the liquid return port and flow for guiding the vapor phase coolant into the condensation chamber cannot be promoted by utilizing the flow of the liquid phase coolant. Therefore, the cooling structure disclosed in the Related Art Patent Reference has a problem in that it is impossible to improve the cooling efficiency by decreasing an area of the boiling surface in the evaporation chamber and, for example, wiring length surrounding an LSI cannot be sufficient shortened.

In view of the above, an object of the present invention is to provide a maintenance-free cooling structure and a cooling method using the same which can effectively perform heat exchange on a boiling surface by taking away (removing) bubbles occurring on the boiling surface by an action other than buoyancy and which requires no power to circulate a coolant and can effectively cool a component to be cooled generating a large amount of heat and can realize its miniaturization and low power consumption.

Solution of the Problems

In order to solve the above problems, according to an aspect of the present invention, there is provided a cooling structure including: an evaporation chamber defined by a base plate, a ceiling plate having a ceiling surface in a lower portion thereof and a side wall having a cylindrical shape, the base plate having a boiling surface which receives heat from a component to be cooled and exchanges heat with a liquid phase coolant; a plurality of plate-shaped fins, which are arranged in parallel in a standing state on the boiling surface of the base plate, defining a plurality of coolant passages in the evaporation chamber, the liquid phase coolant flows through the plurality of coolant passages in one direction from one end portion thereof toward another end portion thereof; a liquid return port, which is formed in a first portion of the side wall facing, without obstruction, the end portion of the plurality of coolant passages, through which the liquid phase coolant obtained by liquefaction of a vapor phase coolant in a condensation chamber flows into the evaporation chamber; and a vapor port, which is formed in a portion of the ceiling plate adjacent to a second portion of the side wall facing, without obstruction, the other end portion of the plurality of coolant passages, through which the vapor phase coolant obtained by evaporation of the liquid phase coolant in the evaporation chamber is guided into the condensation chamber, wherein a first clearance between the one end portion of the plurality of plate-shaped fins and the first portion of the side wall is set to be less than a second clearance between the other end portion of the plurality of plate-shaped fins and the second portion of the sidewall, and wherein space is formed between the ceiling surface and an upper end portion of the plurality of plate-shaped fins, the space expanding gradually from a liquid return port side of the side wall toward the vapor port.

EFFECTS OF INVENTION

According to a cooling structure of the present invention, a liquid phase coolant, without staying between a vapor port and liquid return port, flows into an evaporation chamber from the liquid return port and flows toward a direction of the vapor port located on a side opposite to the liquid return port in a manner to trace a boiling surface in the evaporation chamber. Therefore, bubbles in a vapor phase state produced by evaporation caused by contact of the liquid phase coolant with the boiling surface are immediately moved (taken away) by flowing load of the liquid phase coolant flowing in parallel to the boiling surface and are allowed to rise by buoyancy of bubbles themselves. The vapor phase coolant is allowed to smoothly flow into an aperture of the vapor port mounted on a side of the liquid return port and, after phase change from vapor to liquid in the condensation chamber, the resulting liquid phase coolant can flow into the evaporation chamber. Therefore, the cooling capacity is not lowered by remaining of bubbles in the vapor phase state on the boiling surface and remaining portion for the liquid phase coolant in the evaporation chamber is not formed, whereby the liquid phase coolant is allowed to effectively be in contact with the boiling surface to perform efficient cooling. As a result, a decrease of the boiling surface area is achieved, thus improving the cooling capability.

BRIEF DESCRIPTION OF DRAWINGS

The above and other objects, advantages, and features of the present invention will be more apparent from the following description taken in conjunction with the accompanying drawings in which.

BEST MODE OF CARRYING OUT THE INVENTION

A liquid phase coolant flows from a liquid return port having its aperture in a position neighboring an end edge of a boiling (heating) surface in an evaporation chamber receiving heat from a component to be cooled in a direction parallel to the boiling surface and comes into contact with the boiling surface, beginning with its edge, and, while maintaining the flowing direction, further continues to flow toward a vapor port having its aperture on a side opposite to the liquid return port with the boiling surface interposed between the liquid return port and vapor port. The above vapor port is formed in an upper portion along a side wall surface of the evaporation chamber or in the upper portion in the side wall surface so that the liquid phase coolant comes into contact with the boiling surface and, as a result, is evaporated by a phase change to become vapor phase coolant which then sticks to the boiling surface in a bubble state and is peeled off the boiling surface and rises by receiving flowing load of the liquid phase coolant flowing in parallel to the boiling surface. The liquid return port is formed in a position neighboring an end edge of the boiling surface on a side opposite to the vapor port with the boiling surface located in a side wall of the evaporation chamber interposed between the liquid return port and the vapor port.

The liquid return passage causing the liquid return port to communicate with a condensation chamber is formed so that a flow-in direction of the liquid phase coolant flowing from the boiling surface into the evaporation chamber is parallel to the boiling surface. On the boiling surface, a plurality of plate-shaped fins having its plate thickness being larger than a distance among surfaces of the fins facing one another are mounted so as to be parallel to the flow-in direction of the liquid phase coolant from the liquid return port.

Hereinafter, exemplary embodiments of the present invention are described in detail with reference to drawings.

First Exemplary Embodiment

Figure 1:
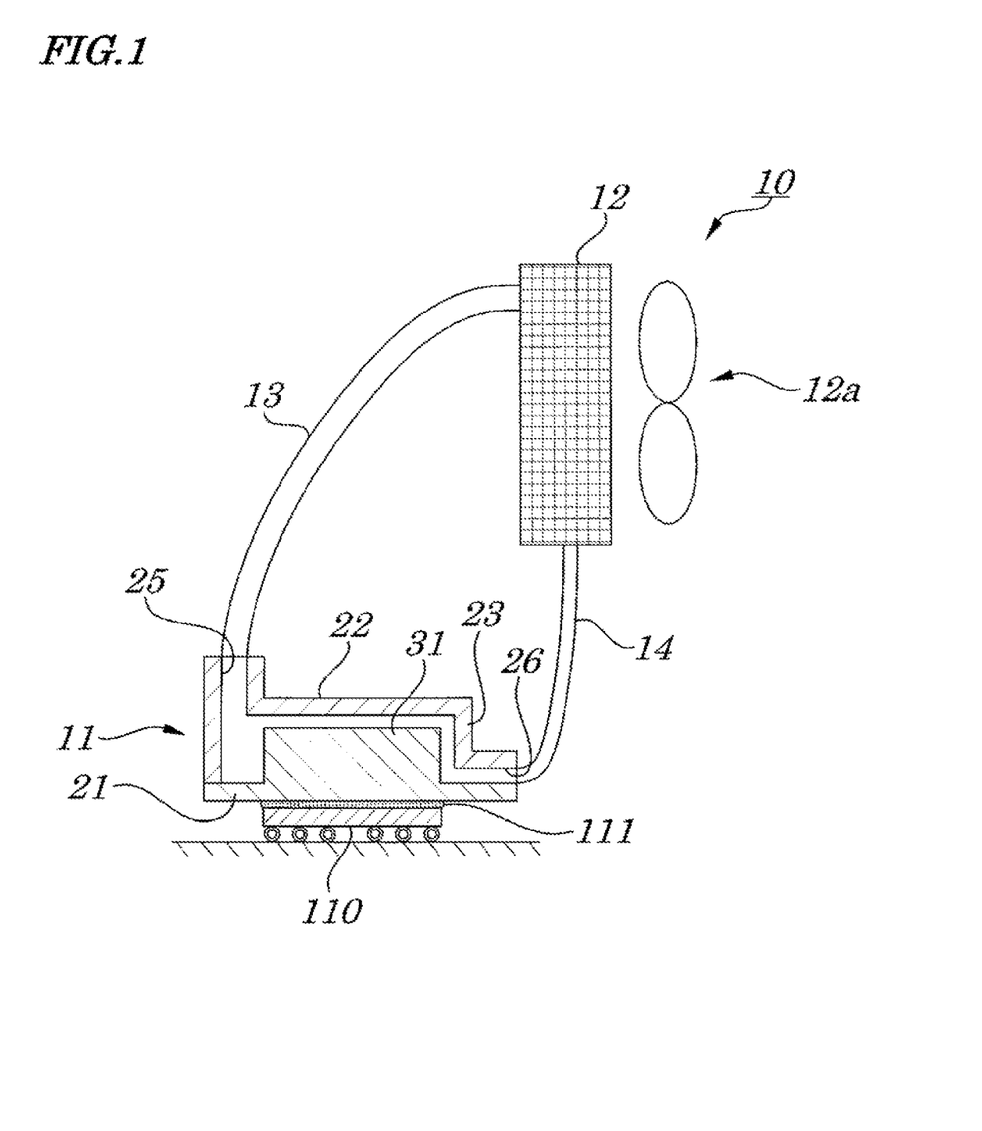
FIG. 1 is a conceptual connection diagram showing a diagrammatic configuration of a cooling unit having an evaporation chamber using a cooling structure according to a first exemplary embodiment of the present invention.
Figure 2:
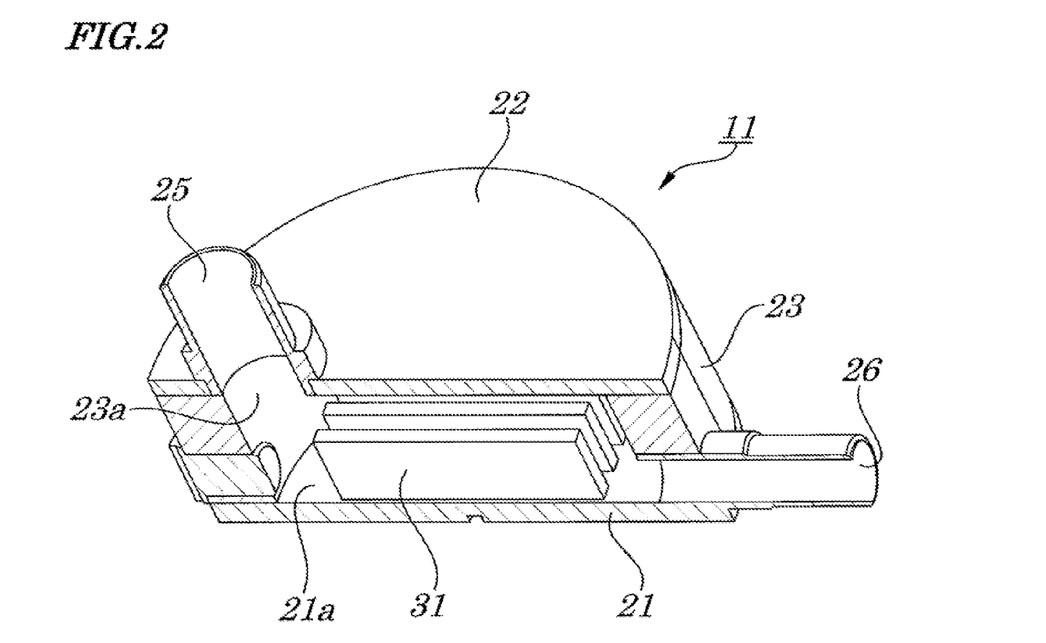
FIG. 2 is a perspective cross-sectional diagram showing an internal structure of an evaporation chamber of the first exemplary embodiment of the present invention.
Figure 3:
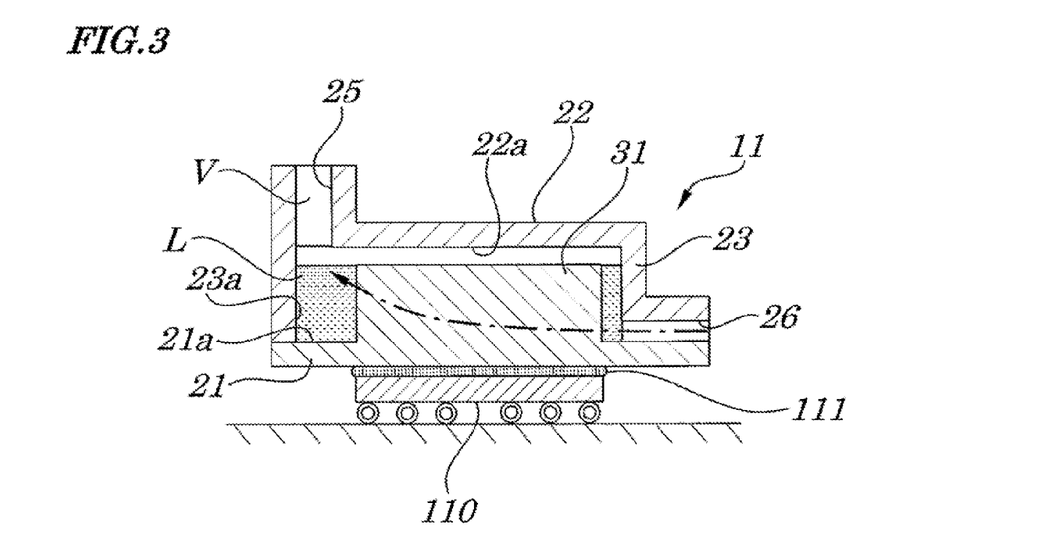
FIG. 3 is a vertical cross-sectional view showing an internal structure of the evaporation chamber of the first exemplary embodiment of the present invention.
Figure 4:
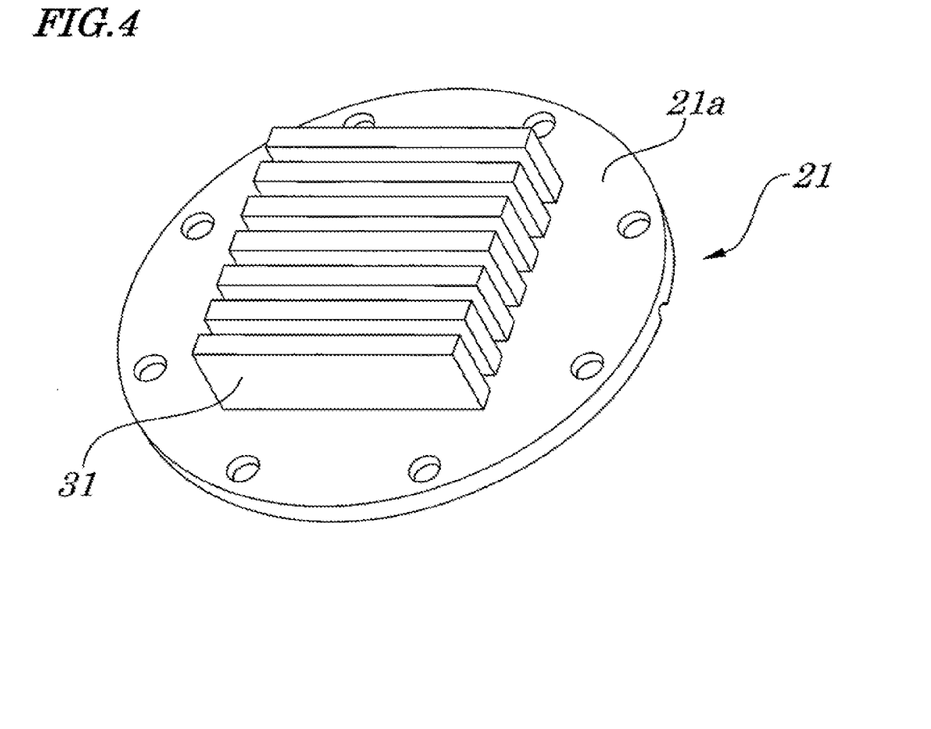
FIG. 4 is a perspective view showing a structure of a base plate in the cooling unit of the first exemplary embodiment.
Figure 5:
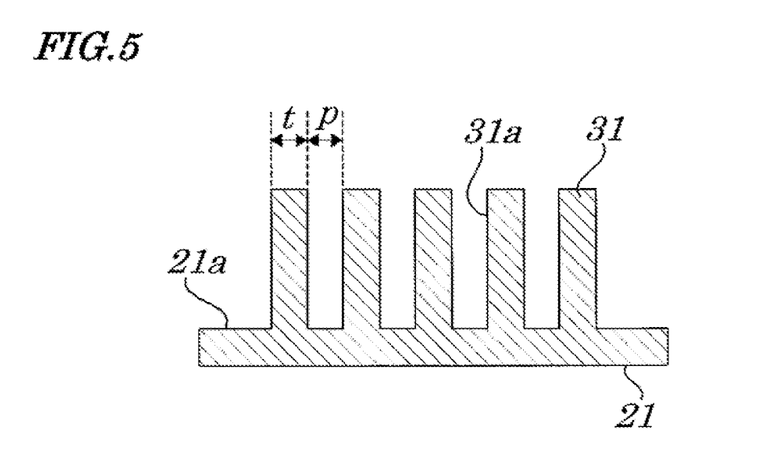
FIG. 5 is a vertical cross-sectional view showing a structure of plate-shaped fins formed integrally with the base plate of the first exemplary embodiment.

FIGS. 1 to 5 are diagrams showing a cooling structure according to a first exemplary embodiment of the present invention. FIG. 1 is a conceptual diagram showing diagrammatically an entire configuration of a cooling unit having the cooling structure. FIG. 2 is a perspective diagram of a vertical cross section showing an internal structure of an evaporation chamber of the cooling unit. FIG. 3 is a vertical cross-sectional view showing an internal structure of the evaporation chamber. FIG. 4 is a perspective view showing a structure of a boiling surface in the cooling unit. FIG. 5 is a vertical cross-sectional view showing a structure of plate-shaped fins on the boiling surface in the cooling unit. Here, each component of the cooling unit is shown in the drawings so that an up-and-down direction of its actual posture coincides with an up-and-down direction of each component shown in each drawing.

As shown in FIG. 1, the cooling unit 10 is attached onto an LSI package 110 (component to be cooled), which is mounted within a server and client making up a network to transmit data or within an electronic device or a like such as a personal computer and generates heat when being operated, so as to be in contact with an evaporation chamber 11 through a heat transfer layer 111 having an excellent heat-transfer efficiency of heat transfer. The evaporation chamber 11 is mounted onto the LSI package 110 in a horizontal posture and is connected to a condensation chamber 12 located upward through a vapor pipe (vapor passage) 13 and a liquid return pipe (liquid return passage) 14. Moreover, a silicone grease or a heat radiation sheet may be used as the heat transfer layer 111.

The cooling unit 10, by allowing a liquid phase coolant to indirectly contact with the LSI package 110 to be boiled and evaporated, brings about a phase change (evaporation) in the coolant L housed in the evaporation chamber 11 from liquid (liquid coolant L) to vapor (vapor coolant V) and then cools the LSI package 110 by latent heat. The resulting vapor phase coolant V rises by buoyancy (owing to pressure difference caused by volume expansion) corresponding to a specific gravity of the liquid phase coolant L and raises pressure in the evaporation chamber 11 by its volume expansion. Then, the vapor phase coolant V, in order to be moved to a low pressure chamber, that is, a low temperature chamber, is introduced from the evaporation chamber 11 into the condensation chamber 12 through the vapor pipe 13 where a phase change occurs from vapor to liquid (liquefied) . On the other hand, the liquid phase coolant L falls due to the action of gravity corresponding to a specific gravity of vapor such as the vapor phase coolant V and is returned and circulated into the evaporation chamber 11 through the liquid return pipe 14. Thus, the cooling unit 10 employs a cooling method utilizing the flow of the coolant L, V as described above and, therefore, no power to circulate the coolant L, V is required (that is, no power is consumed) and, in principle, the cooling unit 10 is maintenance-free.

The condensation chamber 12 of the cooling unit 10 is configured to have a general structure. To explain briefly, the condensation chamber 12 has space to house the vapor coolant V, on an outer surface of which a plurality of heat radiating fins (not shown) is formed to expand its surface area and blasts from a fan 12a are blown onto the heat radiating fins to facilitate its heat radiation. The condensation chamber 12 condenses the vapor phase coolant V to bring about a phase change from vapor (vapor phase coolant V) to liquid (liquid phase coolant L) by radiating heat (that is, removing heat) of the vapor phase coolant V introduced therein into the outside air to cool the condensation chamber 12.

The evaporation chamber 11 to be used as space (chamber) for housing the liquid phase coolant L is made up of a disc-shaped base plate 21 configured to allow the liquid phase coolant L housed therein to come into contact with its boiling surface 21a by being contacted through the heat transfer layer 111 with the LSI package 110 to perform a heat exchange process (cooling process), of a ceiling plate 22 configured to have a shape of a disc with the same diameter as the base plate 21, and of a cylindrical plate 23 configured to have a cylindrical shape with height being lower than a radius of each of the base plate 21 and the ceiling plate 22 and to be mounted hermetically on outer edges of both the base plate 21 and ceiling plate 22 in a fixed manner. Moreover, the base plate 21 is preferably made of a metal material such as copper or aluminum having high thermal conductivity. The ceiling plate 22 and cylindrical plate 23 may be made of a resin material or the like other than metal, however, from a viewpoint of strength or a like, are more preferably made of a metal material.

In the evaporation chamber 11, a vapor port 25 to be connected to the vapor pipe 13 has its aperture on a ceiling surface (inner wall surface) 22a making up a lower surface of the ceiling plate 22 and is formed in a neighboring position along an inner circumferential surface 23a of the cylindrical plate 23. The vapor port 25 is configured to communicate with the vapor pipe 13 in an upper direction. The extending direction of the vapor pipe 13 coincides with the rising direction of the vapor coolant V. Moreover, a liquid return port 26 to be connected to the liquid return pipe 14 has its aperture at a side wall plate (on an inner wall surface) 23 of the evaporation chamber 11 which is located on a side opposite to the vapor port 25 relative to the center of the internal space in the evaporation chamber 11 and extends along its boiling surface 21a of the base plate 21 and is positioned in a neighboring position at its end edge. The liquid return port 26 is formed so as to communicate with the liquid return pipe 19 toward a side direction being a normal line direction of the cylindrical plate 23 in a manner in which the flow-in direction of the liquid phase coolant L flowing from the liquid return pipe 14 is in parallel to the boiling surface 21a of the base plate 21. That is, the apertures operating as the vapor port 25 and liquid return port 26 are formed in opposite to each other with the boiling surface 21a sandwiched therebetween and the liquid return port 26 has the opening at a position being straightly near to the end edge of the boiling surface 21a.

Thus, in the evaporation chamber 11, the following cooling method using the flow of the coolant is carried out. That is, the liquid phase coolant L flows into the evaporation chamber 11 in a manner to be in parallel to the boiling surface 21a and further flows toward the vapor port 25 located on the side opposite to the liquid return port 26 in a manner to trace the boiling surface 21a. Since the liquid return port 26 has its aperture in a circumferential edge portion of the boiling surface 21a located in a downward direction and the vapor port 25 also has its aperture in a circumferential edge portion of the ceiling surface 22a located in an upward direction, the liquid phase coolant L flows in the evaporation chamber 11 while keeping contact with the boiling surface 21a in a manner to effectively utilize its entire surface without staying of the liquid phase coolant L in a place near to the inner circumference surface 23a of the cylindrical plate 23. As a result, the liquid phase coolant L flows therein smoothly with keeping a parallel contact position between the liquid phase coolant L and boiling surface 21a without causing decrease in its flowing speed by contact interference of the liquid phase coolant L staying therein contact with the boiling surface 21a. By configuring as above, the vapor phase coolant V evaporates by coming in contact with the boiling surface 21a of the base plate 21 to which heat has been transferred, however, does not stay on the surface of the boiling surface 21a and, as shown by an arrow of a dashed line in FIG. 3, is peeled off and moved (taken off) by receiving a flowing load of the liquid phase coolant L flowing thereon and then rises up in a smaller bubble state more rapidly when compared with the case where the vapor phase coolant V rises up from the boiling surface 21a by buoyancy of the vapor phase coolant V itself. Moreover, as in the case of the vapor phase coolant L, the temperature of the liquid phase coolant L rises by coming in contact with the boiling surface 21 and, therefore, the liquid phase coolant L moves in the same manner as in the vapor phase coolant V to smoothly circulate in the evaporation chamber 11. Thus, there occurs no decrease in cooling capability of the base plate 21 caused by remaining and expansion of bubbles of the vapor phase coolant V on the surface of the boiling surface 21a of the base plate 21 and, as a result, the flowing liquid phase coolant L can achieve heat exchange (cooling) by evaporating and generating bubbles effectively and repeatedly after the heat has been transferred to the base plate 21.

Moreover, as shown in FIG. 4, a plurality of plate-shaped fins 31 is arranged in parallel in a standing state on the boiling surface 21a of the base plate 21 in a manner to be in parallel to a flowing direction of the liquid phase coolant L moving from the liquid return port 26 toward the vapor port 25. The plate-shaped fins 31 are mounted in a manner in which each of the plate-shaped fins 31 has a height being lower than the cylindrical plate 23 and space is formed to a certain extent between each of the fins 31 and the ceiling surface 22a of the ceiling plate 22.

As shown in FIG. 5, each of the plate-shaped fins 31 is formed so that its plate thickness "t" is larger than a distance among plate-shaped fins 31 facing one another "p" and all the plate-shaped fins 31 facing one another have a same dimension. Moreover, these plate-shaped fins 31 may be fabricated by using a cutting and milling method, extrusion molding method, or forging method.

By configuring as above, in the evaporation chamber 11, the following cooling method using the flow of the coolant is carried out. That is, the liquid phase coolant L flowing into the evaporation chamber 11 comes into contact with not only the boiling surface 21a of the base plate 21 but also the surface of a side surface 31a of the plate-shaped fins, whereby cooling efficiency can be improved. The liquid phase coolant L flows in the passages interposed among the plate-shaped fins 31 with the same flow-in pressure as applied when returning from the liquid return port 26 and flows toward the vapor port 25 at an increased flowing speed. Therefore, the vapor phase coolant V occurring in a bubble state on the boiling surface 21a of the base plate 21 and/or at the side surfaces 31a of the plate-shaped fins 31 are moved together with the liquid phase coolant L flowing at high speed and are allowed to rise by buoyancy and, as a result, cooling capability of the liquid phase coolant L can be improved. The thickness t of each of the plate-shaped fins 31 may be determined depending on a cross-sectional aperture area (passage resistance) of the vapor pipe 13 or the liquid return pipe 14, together with a layout of the evaporation chamber 11 and/or condensation chamber 12 in the cooling unit 10 so that the ratio of the thickness "t" of each of the plate-shaped fins 31 to the distance among plate-shaped fins 31 facing one another "p" is $p/t \leq 1$. Moreover, the plate-shaped fin 31, by setting its thickness "t" to be larger than the distance among plate-shaped fins 31 facing one another "p", can increase the flowing speed of the liquid phase coolant L by two times or more when compared with the case where no plate-shaped fins 31 are mounted. On the other hand, though the surface area of the boiling surface 21 on the plate-shaped fins 31 is reduced to about one-half or less due to the formation of the plate-shaped fins 31, since the surface area of the plate-shaped fins 31 also functions as the boiling surface, no decrease occurs in cooling capability and, on the contrary, owing to the improvement in the flowing speed of the liquid phase coolant L, the cooling capability is more improved.

The kind and/or internal mounting pressure of the coolant to be housed in the evaporation chamber 11 may be selected and set by taking the guaranteed operating temperature of the LSI package 110 into consideration. For example, by selecting a low boiling point coolant such as fluorocarbon or hydrofluoroether whose saturated vapor pressure in an environment at several tens of degrees Celsius becomes an atmospheric pressure or less or approximately the atmospheric pressure and by housing the selected coolant therein in a reduced pressure state, a risk caused by pressure leakage can be reduced. The amount of the coolant to be housed in the evaporation chamber 11 may be adjusted according to the amount of heat to be generated from the LSI package 110 to be cooled to the degree to which no drying-out occurs on the boiling surface 21a of the base plate 21. Therefore, as materials or methods for carrying out bonding among the base plate 21, ceiling plate 22, and cylindrical plate 23 in the evaporation chamber 11, sealing materials such as an O-ring and screws may be used in combination and, further, adhesion and/or brazing methods also may be employed. However, evacuation is performed in the inside of the evaporation chamber 11 to lower a boiling point temperature of the coolant to be housed compared with a boiling point applied in a normal pressure environment and, therefore, a bonding method is to be employed that can prevent the occurrence of leakage (coolant loss) caused by a pinhole or the like under the pressure difference of at least 0.1 MPa or higher.

Each of the vapor pipe 13 and liquid return pipe 14 of the evaporation chamber 11 employs a length of hose (tubing material) used for coolant the passage shape of which is freely deformable and the internal pressure of which is freely reducible and has no adiabatic function. The vapor pipe 13 and liquid return pipe 14 configured above are to be connected respectively to the vapor port 25 and liquid return port 26, as described above. As a result, the evaporation chamber 11 and condensation chamber 12 are allowed to be laid out so as to have a free positional relation, thus allowing the evaporation pipe 13 and liquid return pipe 14 to perform a process of heat exchange with outside air for heat radiation.

Moreover, the evaporation chamber 11 is formed so that there is a relation of i/o=½ between the aperture area "i" of its liquid return port 26 and the aperture area "o" of its vapor port 25. Now, in the evaporation chamber 11, the vapor phase coolant V flows out of the vapor port 25 at a flow rate corresponding to its internal pressure while the liquid phase coolant L flows therein from the liquid return port 26 at a pressure corresponding to the layout of the condensation chamber 12 and to the cross-sectional aperture area of the liquid return pipe 14. Generally, in the evaporation chamber 11, while the liquid phase coolant L performs a process of effective heat exchange with the base plate 21, if an amount of generated vapor phase coolant V increases, the internal pressure rises and if the flow-out pressure of the vapor phase coolant V from the vapor port 25 is higher than the flow-in pressure of the liquid phase coolant L from the liquid return port 26, the vapor phase coolant V attempts to flow out of the liquid return port 26.

The liquid return port 26 is formed so that its aperture area "i" is ½ of the aperture area "o" of the vapor port 25 and, therefore, a flowing amount of the coolant is reduced, which enables an increase in flow-in pressure of the liquid phase coolant L. As a result, in the evaporation chamber 11, the following cooling method using the flow of the coolant is carried out. That is, the flow-in pressure of the liquid phase coolant L flowing from the liquid return port 26 becomes higher than the flow-out pressure of the vapor phase coolant V therein, with a sufficiently large pressure difference, which prevents the flow-out (reverse flow) of the liquid phase coolant L from the liquid return port 26 caused by higher flow-out pressure of the vapor phase coolant V and which enables the coolant to circulate between the evaporation chamber 11 and condensation chamber 12. Moreover, the aperture area "o" of the vapor port 25 and the aperture area "i" of the liquid return port 26 can be adjusted by changing the vertical cross-sectional area (pipe diameter) of the vapor pipe 13 and liquid return pipe 14 or a diameter of a fitting of the vapor port 25 and liquid return port 26.

Thus, according to the present embodiment, no place where the liquid phase coolant L stays is formed near to the cylindrical plate 23 in the evaporation chamber 11 which allows the liquid phase coolant L to smoothly flow in the direction from the liquid return port 26 toward the vapor port 25. As a result, no decrease occurs in cooling capability caused by remaining of bubbles generated by the vapor phase coolant V on the boiling surface 21a of the base plate 21 in the evaporation chamber 11 and/or on the surface of the plate-shaped fin 31 which facilitates effective contact of the liquid phase coolant L for smooth heat exchange (cooling). Therefore, in the cooling unit 10 of the present embodiment, since cooling efficiency (heat transfer rate) by its base plate 21 is large, occupied area can be reduced and effective cooling can be realized even in the LSI package 110 generating a large amount of heat. As a result, a wiring length from the LSI package 110 can be made shorter to increase a memory device or the like and such a pump requiring power is not required, thus achieving an improvement in operation speed of a computer.

Second Exemplary Embodiment

Figure 6:
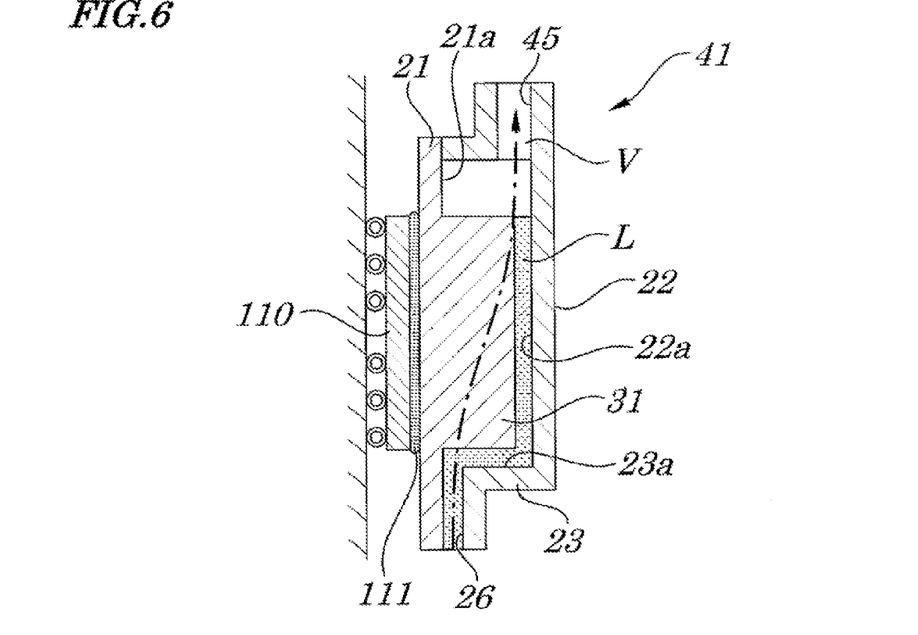
FIG. 6 is a vertical cross-sectional diagram showing an internal structure of an evaporation chamber using a cooling structure according to a second exemplary embodiment of the present invention.

FIG. 6 is a diagram showing a cooling structure according to a second exemplary embodiment of the present invention. That is, FIG. 6 is a vertical cross-sectional view showing an internal structure of an evaporation chamber in a cooling unit employing the above cooling structure. In the second exemplary embodiment, the cooling structure is approximately the same as for the first exemplary embodiment and, therefore, features of the invention are described by assigning same reference numbers to components having the same configuration. (The same applies to other exemplary embodiments described below.)

As shown in FIG. 6, an evaporation chamber 41 of a cooling unit 10 is mounted, through a heat transfer layer 111, on an LSI package 110, in a manner in which its boiling surface 21a of a base plate 21 is in a vertical posture. A cylindrical plate 23 is hermetically mounted, in a fixed manner, on a circumferential edge of each of the base plate 21 and a ceiling plate 22 of the evaporation chamber 41 so that the ceiling plate 22 and the base plate 21 face one another.

A vapor port 45 to be connected to a vapor pipe 13, unlike the vapor port 25 in the first exemplary embodiment, has its aperture through the cylindrical plate 23 in a position neighboring to a ceiling surface 22a of the ceiling plate 22 on a side opposite to a liquid return port 26.

The evaporation chamber 41 is mounted in a manner in which its vapor port 45 is positioned in an upper most portion and its liquid return port 26 is positioned in a lowest portion. That is, space (chamber) to house liquid phase coolant L is formed by the base plate 21, ceiling plate 22, and cylindrical plate 23 and the liquid return port 26 is connected to a liquid return pipe 14 extending downward and the vapor port 45 is connected to the vapor pipe 13 extending upward.

By configuring as above, in the evaporation chamber 41, the following cooling method utilizing the flow of the coolant is carried out. That is, the liquid return port 26 located neighboring the base plate 21 and vapor port 45 neighboring the ceiling plate 22 face each other in a vertical direction and, therefore, the vapor phase coolant V, as shown by an arrow of a dashed line in FIG. 6, rises smoothly approximately vertically and is guided into the vapor port 45 to enter the condensation chamber 12. Moreover, since the evaporation chamber 41 is mounted in a vertical posture, the liquid phase coolant L housed therein can flow, by producing convection currents corresponding to temperatures, toward a vertical direction coinciding with a flow-in direction from the liquid return port 26 by producing convection currents corresponding to temperatures.

Thus, according to the present embodiment, in addition to effects obtained from the above first exemplary embodiment, effects can be achieved that the vapor phase coolant V can be flown smoothly and the liquid phase coolant L can flow by convection currents produced in the same direction. Therefore, cooling efficiency of the base plate 21 can be improved.

Incidentally, a modified embodiment of the second exemplary embodiment is here described without illustrations. That is, according to the modified embodiment, the evaporation chamber 41 may be mounted in a horizontal posture as in the case of the first exemplary embodiment and/or in a vertical posture as in the case of the second exemplary embodiment. By configuring as above, approximately the same action and effect as in the above embodiment can be realized and, in any case, mounting posture may be selected according to embodiments so that the vapor phase coolant V can rise smoothly.

Third Exemplary Embodiment

Figure 7:
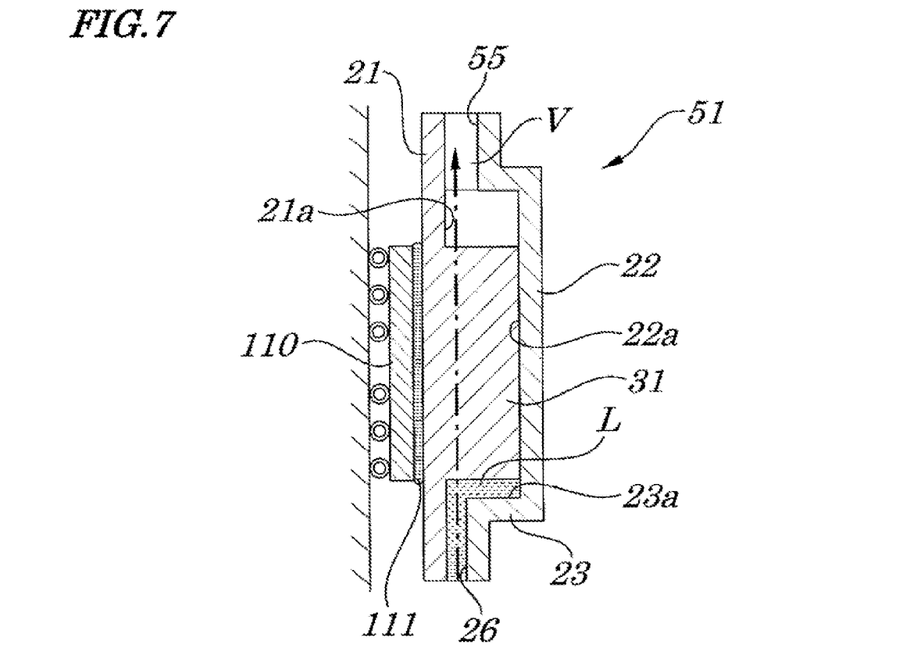
FIG. 7 is a vertical cross-sectional diagram showing an internal structure of an evaporation chamber using a cooling structure according to a third exemplary embodiment of the present invention.

FIG. 7 is a diagram showing a structure for cooling according to a third exemplary embodiment of the present invention. That is, FIG. 7 is a vertical cross-sectional view showing an internal structure of an evaporation chamber in a cooling unit employing the above structure for cooling.

As shown in FIG. 7, in an evaporation chamber 51 of a cooling unit 10, as in the above second exemplary embodiment, a base plate 21 and ceiling plate 22 are mounted in a manner to be vertical to an LSI package 110. On a circumferential edge of each of the base plate 21 and ceiling plate 22, instead of the cylindrical plate 23 employed in the second exemplary embodiment, a cylindrical plate 53 is mounted hermetically in a fixed manner so as to have a same height as a plate-shaped fin 31.

A vapor port 55 to be connected to a vapor pipe 13 has, instead of the vapor port 45 in the above second exemplary embodiment and as in the case of the liquid return port 26, its aperture through the cylindrical plate 53 located in a position opposite to a liquid return port 26 and neighboring to a boiling surface 21a of the base plate 21.

By configuring as above, in an evaporation chamber 51, the following cooling method utilizing the flow of the coolant is carried out. That is, the vapor port 55, as in the case of the liquid return port 26, has its aperture on the base plate 21 side and, therefore, vapor phase coolant V, as shown by an arrow of a dashed line in FIG. 7, rises upward straightly and vertically and is guided into the vapor port 45 more smoothly compared with the second exemplary embodiment using the vapor port 45 and then enters a condensation chamber 12. Moreover, liquid phase coolant L producing convection currents in the evaporation chamber 51, unlike in the second exemplary embodiment, does not produce convection currents among plate-shaped fins 31 and ceiling plate 22 and, as a result, flows at high speed among the plate-shaped fins 31.

Thus, according to the present embodiment, in addition to effects obtained from the above first and second exemplary embodiments, effects can be achieved that the vapor phase coolant V can be flown more smoothly and the liquid phase coolant L can flow among plate-shaped fins 31. Therefore, the cooling efficiency of the base plate 21 can be improved.

Incidentally, a modified embodiment of the third exemplary embodiment is here described without illustrations. That is, according to the modified embodiment, same actions and effects can be realized by increasing a volume housing the liquid phase coolant L in the evaporation chamber 11 of the above first exemplary embodiment to a degree to which upper portions of the plate-shaped fins 31 are exposed.

Fourth Exemplary Embodiment

Figure 8:
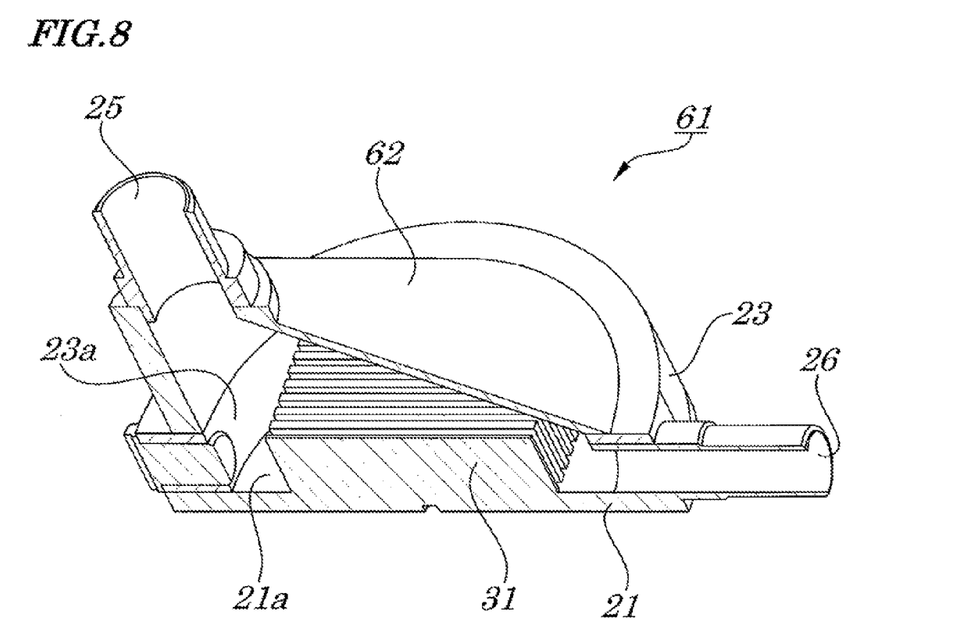
FIG. 8 is a vertical cross-sectional diagram showing an internal structure of an evaporation chamber using a cooling structure according to a fourth exemplary embodiment of the present invention.
Figure 9:
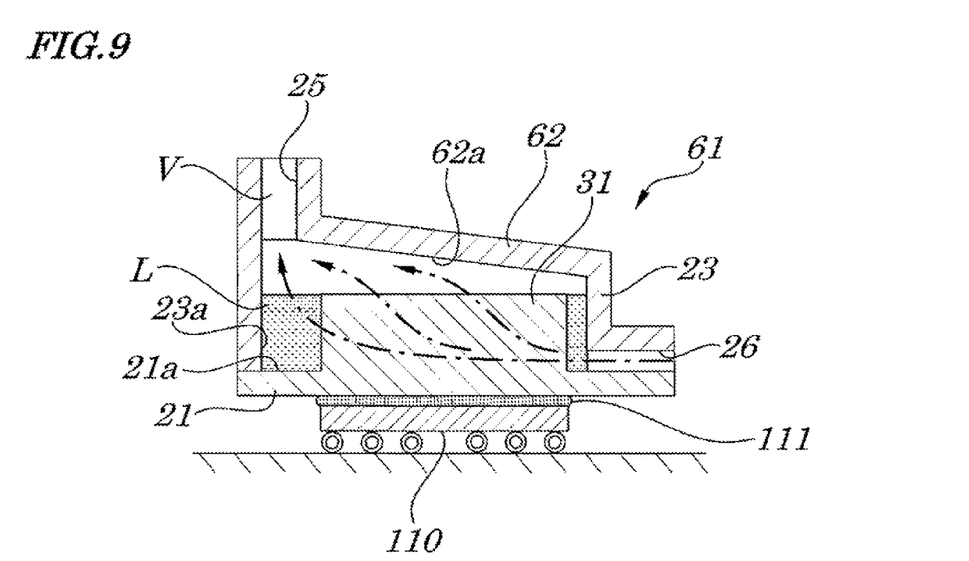
FIG. 9 is a vertical cross-sectional diagram showing an internal structure of an evaporation of the fourth exemplary embodiment.

FIGS. 8 and 9 are diagrams showing a structure for cooling according to a fourth exemplary embodiment of the present invention. That is, FIG. 8 is a vertical cross-sectional perspective view showing an internal structure of an evaporation chamber in a cooling unit 10 employing the above cooling structure. FIG. 9 is a cross-sectional view showing an internal structure of an evaporation chamber 61 in the cooling unit 10.

As shown in FIGS. 8 and 9, in the evaporation chamber 61 of the cooling unit 10, a base plate 21 is mounted on an LSI package 110 in a horizontal posture, as in the first exemplary embodiment case. On a circumferential edge of the base plate 21, an edge on one end side of a cylindrical plate 23 is mounted hermetically in a fixed manner and on an edge on another end side of the cylindrical plate 23, a ceiling plate 62 is mounted hermetically in a fixed manner instead of the ceiling plate 22 in the above first exemplary embodiment.

A ceiling plate 62 has so-called a deformed funnel-shaped structure in which a circumferential edge side portion functions as its aperture edge and a vapor port 25 is used as its lowest flow-out port and, in an actual configuration, the ceiling plate 62 is mounted on the cylindrical plate 23 in a fixed manner in a state where the ceiling plate 62 is turned upside down. That is, the space between the ceiling plate 62 and a boiling surface 21a of the base plate 21 expands gradually in a taper-shaped manner from a liquid return port 26 position toward the vapor port 25 position.

By configuring as above, in the evaporation chamber 61, the following cooling method utilizing the flow of the coolant is carried out. That is, clearance space is formed between a ceiling surface 62a of the ceiling plate 62 and the boiling surface 21a of the base plate 21 has a taper-shape which allows the flow of the coolant to converge from the liquid return port 26 side to the vapor port 25 position and, therefore, the farther a position of the clearance space from the liquid return port 26, becomes, the larger clearance space is ensured above the plate 21 and plate-shaped fins 31. Incidentally, the liquid phase coolant V produced by the phase change from liquid to vapor due to contact of the liquid phase coolant L with the boiling surface 21a of the liquid phase coolant L and/or plate-shaped fins 31 gets into a state of the greater amount of bubbles, the farther the vapor phase liquid V is apart from the liquid return port 26, and moves and flows toward the vapor port 25 together with the liquid phase coolant L. As a result, a rate of an amount of the flowing coolant having brought about a phase change from liquid to vapor becomes higher on the vapor port side, thus causing a decrease in the amount of the occurrence of phase change, which lowers cooling efficiency of the boiling surface 21a and plate-shaped fins 31. Thus, in the evaporation chamber 61, bubbles of the vapor phase coolant V produced by phase change occurred by contact of the liquid phase coolant L with the boiling phase 21a and phase-shaped fins 31 are allowed to rise upward and can escape into clearance space ensured among the boiling surface 21a, plate-shaped fins 31, and the ceiling surface 62a. The liquid phase coolant L rising in a bubble state, as shown by a chain double-dashed line in FIG. 9, can be smoothly guided, without causing stay of the coolant therein, by the ceiling surface 62a from the liquid return port 26 toward the vapor port 25 and into the condensation chamber 12. As a result, in the evaporation chamber 61, the mixing rate of the vapor phase coolant V with the liquid phase coolant L becomes higher on the side of the vapor port 25, which prevents cooling efficiency from lowering and the boiling surface 21a and the plate-shaped fins 31 bring about efficient phase change in the coolant from liquid to vapor, which realizes an effective process of heat exchange (cooling) therein.

Thus, according to the present embodiment, in addition to effects obtained from the above embodiment, effects can be achieved that neither mixing of the vapor phase coolant V produced by phase change with the liquid phase coolant L nor staying of the coolant in a portion near to the ceiling surface occurs, whereby the coolant can be smoothly guided and introduced into the vapor port 25 and, therefore, no decrease in cooling efficiency of the cooling unit occurs, which enables the LSI package 110 to be cooled effectively.

Incidentally, a modified embodiment of the fourth exemplary embodiment is here described without illustrations. That is, according, to the modified embodiment, space corresponding to an amount of production of the vapor phase coolant V may be ensured between the ceiling surface 22a and a surface of liquid phase coolant L employed in the first exemplary embodiment. By configuring so, the same actions and effects as obtained in the fourth exemplary embodiment can be achieved. However, according to the fourth exemplary embodiment, the taper-shaped space formed between the ceiling surface 22a of the ceiling plate 62 and the boiling surface 21a can guide the vapor phase coolant V, without causing the stay of the coolant, toward the upper portion of the vapor port 25 to facilitate the flow of the coolant and, therefore, the fourth exemplary embodiment can be preferably employed.

Fifth Exemplary Embodiment

Figure 10:
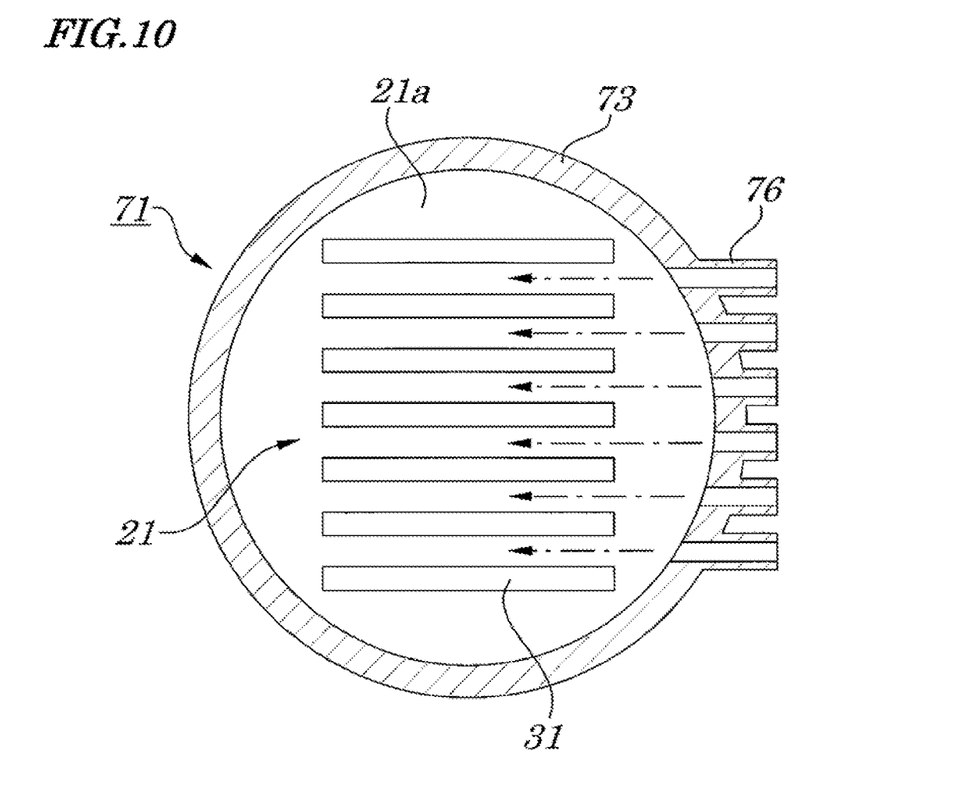
FIG. 10 is a vertical cross-sectional diagram showing an internal structure of an evaporation camber using a cooling structure according to a fifth exemplary embodiment of the present invention.

FIG. 10 is a diagram showing a structure for cooling according to a fifth exemplary embodiment of the present invention. That is, FIG. 10 is a vertical cross-sectional view showing an internal structure of an evaporation chamber 71 in a cooling unit employing the above cooling structure.

As shown in FIG. 10, in an evaporation chamber 71 of a cooling unit 100, a cylindrical plate 73 is mounted hermetically in a circumferential edge of a base plate 21 and a ceiling plate 22. A plurality of liquid return ports 76, which is branched in a parallel direction, has an aperture through the cylindrical plate 73 in a manner to correspond to an extended direction of an interval among a plurality of plate-shaped fins 31 mounted on a boiling surface 21a of a base plate 21 in a standing state.

By configuring as above, in the evaporation chamber 71, the following cooling method utilizing the flow of the coolant is carried out. That is, each of the liquid return ports 76 has its aperture in a manner to correspond to each interval among the plate-shaped fins 31 and, therefore, the liquid phase coolant L can flow smoothly into the interval among the plate-shaped fins 31 and allows the coolant L to flow at high speed among the plate-shaped fins 31.

Thus, according to the present embodiment, in addition to effects obtained from the above embodiment, effects can be achieved that the liquid phase coolant L is allowed to smoothly flow among the plate-shaped fins 31 for high speed flowing therein and, therefore, cooling efficiency in the base plate 21 can be improved.

Incidentally, a modified embodiment of the fifth exemplary embodiment is here described without illustrations. That is, according to the modified embodiment, a liquid return port may have its aperture of a long hole shape with a narrow width which extends in a parallel direction of the plate-shaped fins 31 instead of the branched liquid return port 76 employed in the fifth exemplary embodiment. However, it is necessary that the liquid return port has an aperture whose area is smaller than the vapor port 25 and, therefore, from a viewpoint of design and fabrication, the structure employed in the fifth exemplary embodiment has an advantage.

Sixth Exemplary Embodiment

Figure 11:
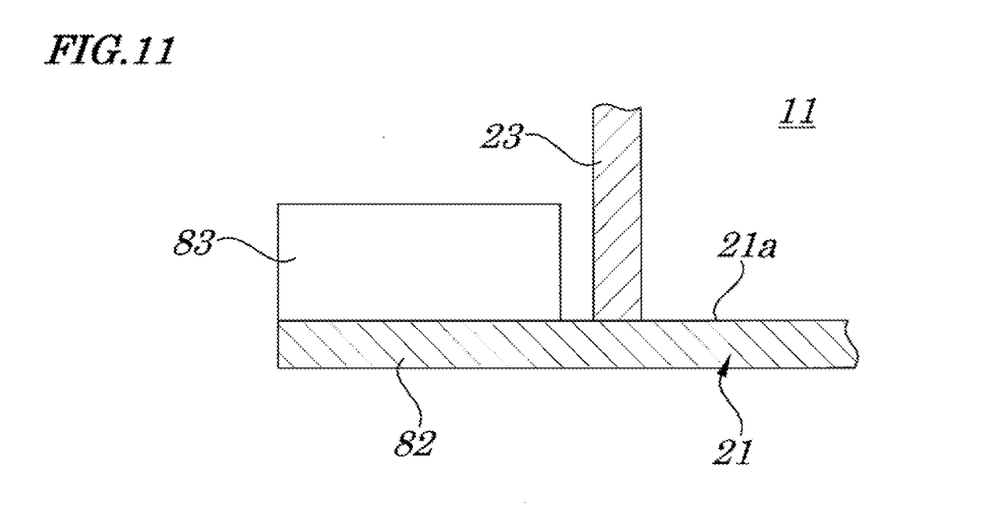
FIG. 11 is a partially expanded cross-sectional view showing an evaporation chamber using a cooling structure according to a sixth exemplary embodiment of the present invention; and, FIG. 12 is a partially expanded cross-sectional view showing a diagrammatic configuration of a cooling unit with an evaporation chamber using a cooling structure of a related art.

FIG. 11 is a diagram showing a structure for cooling according to a sixth exemplary embodiment of the present invention. That is, FIG. 11 is a partially expanded vertical cross-sectional view showing a structure of an evaporation chamber in a cooling unit employing the above structure for cooling.

As shown in FIG. 11, in a base plate 21 making up an evaporation chamber 11 of a cooling unit, an ultrasonic oscillator 83, which operates with small power, is mounted in a fixed manner on an extended portion 82 obtained by extending a cylindrical plate 23 to the outside position in a manner in which oscillation generated by the ultrasonic oscillator 83 propagates to a boiling surface 21a in the evaporation chamber 11 and a surface of a plate-shaped fin 31.

By configuring as above, in the evaporation chamber 11, the following cooling method utilizing the flow of the coolant is carried out. That is, the ultrasonic oscillation occurs also on the boiling surface 21a and the surface of the plate-shaped fins 31 and, therefore, bubbles of the vapor phase coolant V sticking to the surfaces thereof are peeled off from the boiling surface 21a and the plate-shaped fins 31 due to a load generated by flow resistance of the liquid phase coolant L and additional load generated by the ultrasonic oscillation.

Thus, according to the present embodiment, in addition to effects obtained from the above embodiment, effects can be achieved that bubbles adhering to the boiling surface 21a and surface of the plate-shaped fin 31 can be peeled off and allowed to rise by not only the flowing load of the liquid phase coolant L but also the load generated by the ultrasonic oscillation, thus cooling efficiency on the base plate 21 can be improved.

Thus, the embodiments of the present invention are described by referring to the drawings. It is apparent that the present invention is not limited to the above embodiment but may be changed and modified without departing from the scope and spirit of the invention. For example, the present invention can be applied to a cooling unit to connect a condensation chamber to an evaporation chamber according to a different configuration and its evaporation chamber is not limited to a circular chamber.

INDUSTRIAL APPLICABILITY

The present invention can be applied not only to a cooling unit to cool a heat generating portion in an electronic device such as a personal computer but also to other cooling units. For example, the present invention can be applied to an air condition apparatus such as a server room.

EXPLANATION OF LETTERS AND NUMERALS

10: Cooling unit
11, 41, 51, and 61: Evaporation chamber
12: Condensation chamber
13: Vapor pipe (corresponding to vapor passage recited in the claims(s))
14: Liquid return pipe (corresponding to liquid return passage recited in the claim(s))
21: Base plate
21a: Boiling surface
22 and 62: Ceiling plate
22a and 62a: Ceiling surface
23, 53, and 73: Cylindrical plate
23a: Inner circumferential surface (internal wall surface)
25, 45, and 55: Vapor port
26 and 76: Liquid return port
31: Plated-shaped fin
31a: Side surface
83: Ultrasonic oscillator
110: LSI package (corresponding to component to be cooled recited in the claim(s))
L: Liquid phase coolant
p: a distance among plate-shaped fins facing one another
t: plate thickness
V: Vapor phase coolant

What is claimed is:

1. A cooling structure comprising:
    an evaporation chamber defined by a base plate, a ceiling plate having a ceiling surface in a lower portion thereof and a side wall having a cylindrical shape, said base plate having a boiling surface which receives heat from a component to be cooled and exchanges heat with a liquid phase coolant;
    a plurality of plate-shaped fins, which are arranged in parallel in a standing state on said boiling surface of said base plate, defining a plurality of coolant passages in said evaporation chamber, in which the liquid phase coolant flows through said plurality of coolant passages in one direction from one end portion thereof toward another end portion thereof;
    a liquid return port, which is formed in a first portion of said side wall facing, without obstruction, one end portion of said plurality of coolant passages, through which said liquid phase coolant obtained by liquefaction of a vapor phase coolant in a condensation chamber flows into said evaporation chamber, said liquid return port configured so as to be in contact with an edge of said boiling surface; and
    a vapor port, which is formed in a portion of said ceiling plate adjacent to a second portion of said side wall facing, without obstruction, another end portion of said plurality of coolant passages, through which said vapor phase coolant obtained by evaporation of said liquid phase coolant in said evaporation chamber is guided into said condensation chamber, wherein a first clearance between said one end portion of said plurality of plate-shaped fins and said first portion of said side wall is set to be less than a second clearance between said other end portion of said plurality of plate-shaped fins and said second portion of said side wall, and
    wherein space is formed between said ceiling surface and an upper end portion of said plurality of plate-shaped fins, the space expanding gradually from a liquid return port side of said side wall toward said vapor port.

2. The cooling structure according to claim 1, wherein said evaporation chamber is mounted on said component to be cooled in a manner in which its boiling surface is in a horizontal posture and said condensation chamber is located upward of said evaporation chamber.

3. The cooling structure according to claim 1, wherein space between said ceiling surface and said boiling surface expands gradually in a taper-shaped manner from said liquid return port side of said side wall toward said vapor port.

4. The cooling structure according to claim 1, wherein a liquid return passage is formed so that a flow-in direction of said liquid phase coolant flowing into said evaporation chamber from said liquid return port is in parallel with said boiling surface.

5. The cooling structure according to claim 1, wherein each of said plate-shaped fins has a plate thickness set to be not less than a distance between the plate-shaped fins facing one another.

6. The cooling structure according to claim 1, wherein plural liquid return ports are formed in an extension direction of intervals among the plate-shaped fins so as to be in a one-to-one correspondence with plate-shaped fins.

7. The cooling structure according to claim 1, wherein one or both of a liquid return passage to communicate said liquid return port with said condensation chamber and a vapor passage to communicate said vapor port with said condensation chamber are made of a tube material such as a length of hose whose passage shape is freely deformable.

8. The cooling structure according to claim 1, further comprising an ultrasonic oscillator generating ultrasonic oscillation to propagate toward at least said boiling surface of said evaporation chamber.

9. An electronic device in which a boiling-type cooling unit employing a cooling structure stated in claim 1 is mounted on a component requiring cooling.

10. The cooling structure according to claim 1, wherein said plurality of coolant passages each are interposed between any two plate-shaped fins adjacent to each other.

11. The cooling structure according to claim 1, wherein the space is formed between said ceiling surface and said upper end portion of said plurality of plate-shaped fins, in order to make said vapor phase coolant in a bubble state escape rapidly from said coolant passages.

12. The cooling structure according to claim 1, wherein the space is formed as a vapor-only escape passage between said ceiling surface and said upper end portion of said plurality of plate-shaped fins, in order to make said vapor phase coolant in a bubble state escape rapidly from said coolant passages.

13. The cooling structure according to claim 1,
    wherein said plurality of coolant passages each are interposed between any two plate-shaped fins adjacent to each other,
    wherein said liquid phase coolant obtained by liquefaction of a vapor phase coolant in a condensation chamber enters from said liquid return port into said evaporation chamber, and flows through said plurality of coolant passages in the one direction, and
    wherein the space is formed between said ceiling surface and said upper end portion of said plurality of plate-shaped fins, in order to make said vapor phase coolant in a bubble state escape rapidly from said coolant passages.

* * * * *